(12) United States Patent
Testa et al.

(10) Patent No.: US 11,270,825 B2
(45) Date of Patent: Mar. 8, 2022

(54) COIL ACTUATOR FOR LOW AND MEDIUM VOLTAGE APPLICATIONS

(71) Applicant: ABB Schweiz AG, Baden (CH)

(72) Inventors: Marco Testa, Romano di Lombardia (IT); Roberto Usai, Treviolo (IT)

(73) Assignee: ABB Schweiz AG, Baden (CH)

( * ) Notice: Subject to any disclaimer, the term of this patent is extended or adjusted under 35 U.S.C. 154(b) by 300 days.

(21) Appl. No.: 16/559,830

(22) Filed: Sep. 4, 2019

(65) Prior Publication Data
US 2020/0075212 A1    Mar. 5, 2020

(30) Foreign Application Priority Data
Sep. 5, 2018 (EP) .................................... 18192708

(51) Int. Cl.
*H01H 47/00* (2006.01)
*H01F 7/06* (2006.01)
*H03K 3/017* (2006.01)
*H01F 7/08* (2006.01)

(52) U.S. Cl.
CPC ............ *H01F 7/064* (2013.01); *H01F 7/081* (2013.01); *H03K 3/017* (2013.01)

(58) Field of Classification Search
None
See application file for complete search history.

(56) References Cited

U.S. PATENT DOCUMENTS

| 2009/0015979 | A1 | 1/2009 | Fukano et al. |
| 2009/0015980 | A1* | 1/2009 | Fukano ................. H01F 7/1844 361/194 |
| 2018/0174786 | A1 | 6/2018 | Matsuo et al. |

OTHER PUBLICATIONS

European Patent Office, Extended Search Report issued in corresponding Application No. 18192708.8, dated Mar. 1, 2019, 11 pp.

* cited by examiner

*Primary Examiner* — Stephen W Jackson
(74) *Attorney, Agent, or Firm* — Greenberg Traurig, LLP (57) ABSTRACT

A coil actuator for low and medium voltage applications comprising a coil electromagnet provided with a single coil winding and a movable anchor and a power and control unit comprising: a power circuit operatively coupled with said coil electromagnet, said power circuit comprising input terminals, at which said power circuit receives an input voltage; a PWM controller operatively coupled with said power circuit, said PWM controller being adapted to control an input current flowing through said power circuit to obtain and maintain an average operating level selected an excitation current feeding said coil electromagnet. Said PWM controller is adapted to set a plurality of reference values for said input current to control said input current, each reference value for said input current being selected among said plurality of reference values depending on the behavior of said input voltage.

19 Claims, 3 Drawing Sheets

COIL ACTUATOR FOR LOW AND MEDIUM VOLTAGE APPLICATIONS

The present invention relates to a coil actuator for low and medium voltage applications.

For the purposes of the present application, the term "low voltage" is referred to operating voltages lower than 1 kV AC whereas the term "medium voltage" is referred to operating voltages higher than 1 kV AC up to some tens of kV, e.g. 72 kV AC.

Coil actuators are frequently used in medium and low voltage apparatuses, for instance in low or medium voltage circuit breakers, disconnectors, contactors, for a wide variety of applications. As an example, these devices are widely used to release or lock mechanical parts of spring-actuated circuit breakers, following an opening or closing command.

As is known, most traditional coil actuators normally comprise an electromagnet provided with a pair of distinct windings and a driving electronics capable of selectively energizing said windings to move the anchor of the electromagnet from a rest position to an actuated position (launch operation) or maintain said anchor in said actuated position (hold operation) or to allow the return of said anchor in said rest position (release operation).

Recently, coil actuators having an electromagnet provided with a single coil winding (hereinafter referred to as "single coil actuators") have been developed.

An example of these coil actuators is described in EP2149890B1.

In the coil actuator described in this prior art document, a driving electronics controls an excitation current circulating in the electromagnet so that the excitation current takes an average operating level for a certain time interval.

In particular, the driving electronics may control the excitation current circulating in the electromagnet in such a way that this latter takes a predetermined launch level or a predetermined hold level for said excitation current for a corresponding time interval, in which a launch operation or a hold operation of the electromagnet is carried out.

The selection of the average operating level to be obtained for the excitation current is carried out depending on the behavior of an input voltage received by the driving electronics.

Currently available single coil actuators for low and medium voltage applications can be easily adapted to a wide number of intended applications and they can cover broad operational ranges, in terms of voltages and currents. However, even if they are widely and satisfactorily used, these devices have still some aspects to improve.

In currently available single coil actuators, the above-mentioned driving electronics normally includes capacitors (generally of the electrolytic type) to store electric energy necessary to properly drive the electromagnet, particularly when the input voltage is variable, for example because it has a pulsed or a rectified sinusoidal waveform.

The experience has shown how the adoption of such capacitors often represents a limitation for the operating life of the driving electronics as these components are generally subject to noticeable electrical stresses (e.g. due to the presence of in-rush currents during their discharge), which may lead to failure events.

Of course, the above-mentioned drawback adversely affects the reliability of the low or medium voltage apparatus, in which said coil actuators are installed and used.

The main aim of the present invention to provide a coil actuator for medium and low voltage applications that solves the above-mentioned problems.

Within this aim, it is an object of the present invention to provide a coil actuator having a driving electronics for an electromagnet operatively associated thereto, which has a simplified design capable of maintaining, at the same time, the performances needed for properly driving said electromagnet.

Another object of the present invention to provide a coil actuator having a driving electronics for an electromagnet operatively associated thereto, which ensures higher levels of reliability and a longer operating life with respect to solutions used in currently available coil actuators.

Still another object of the present invention is to provide a coil actuator that can be easily manufactured at industrial level at competitive costs with respect to currently available devices of the same type.

Thus, the present invention relates to a coil actuator for low and medium voltage applications according to the following claim 1 and related dependent claims.

In a general definition, the coil actuator, according to the invention, comprises at least a coil electromagnet, which is provided with a single coil winding and a movable anchor, and a power and control unit comprising a power circuit and a PWM controller.

The power circuit is operatively coupled with the coil electromagnet and it comprises input terminals, at which it receives an input voltage.

The PWM controller is operatively coupled with the power circuit to control an input current flowing through the power circuit to obtain an average operating level selected for an excitation current feeding said coil electromagnet.

The PWM controller is adapted to set a plurality of reference values for said input current to control said input current and obtain the average operating level selected for said excitation current.

Each reference value for said input current is selected among said plurality of reference values depending on the behavior of said input voltage.

Preferably, when said input voltage is subject to an increase, the PWM controller is adapted to select:
  a first reference value to be set for said input current until said input voltage is lower than a first threshold value;
  a second reference value to be set for said input current if said input voltage increases above said first threshold value. Said second reference value is higher than said first reference value;
  a third reference value to be set for said input current if said input voltage increases above a second threshold value higher than said first threshold value. Said third reference value is higher than said second reference value.

Preferably, when said input voltage is subject to a decrease, the PWM controller is adapted to select:
  said third reference value until said input voltage is higher than said first threshold value;
  said second reference value if said input voltage decreases under said first threshold value;
  said first reference value if said input voltage decreases under a third threshold value lower than said first threshold value.

The power and control unit comprises first sensing means adapted to provide first detection signals indicative of a behavior of said input voltage. The PWM controller is adapted to receive and process said first detection signals.

The power and control unit comprises second sensing means adapted to provide second detection signals indicative of a behavior of said input current. The PWM controller is adapted to receive and process said second detection signals.

The power circuit comprises a discharge circuit, which is electrically connected with a first input terminal and an electric node of said power circuit in parallel with said coil electromagnet.

The power circuit comprises a switch circuit, which is electrically connected with said electric node and a second input terminal of said power circuit. The switch circuit comprises at least a power switch. The PWM controller is operatively coupled with said switch circuit to control operation of said at least a power switch.

Said at least a power switch comprises a power switch adapted to switch with a given switch frequency between a conduction state, at which said input current is allowed to flow through said power circuit, and an interdiction state, at which said input current is interrupted. A discharge current flows along said discharge circuit, when said power switch is in a conduction state.

The PWM controller is adapted to control a duty-cycle value of said power switch in order to make said input current to reach a reference value set for said input current.

The PWM controller is adapted to select an average operating level to be obtained for the excitation current and a corresponding plurality of reference values to be set for said input current depending on one or more characteristic parameters of said input voltage.

The PWM controller is adapted to select the average operating level to be obtained for said excitation current and a corresponding plurality of reference values to be set for said input current in response to control signals received at a communication port.

In a further aspect, the present invention relate to a low or medium voltage apparatus according to claim 12.

Further characteristics and advantages of the present invention will emerge from the description of preferred, but not exclusive, embodiments of the panel according to the invention, non-limiting examples of which are provided in the attached drawings, wherein.

Figure 1:
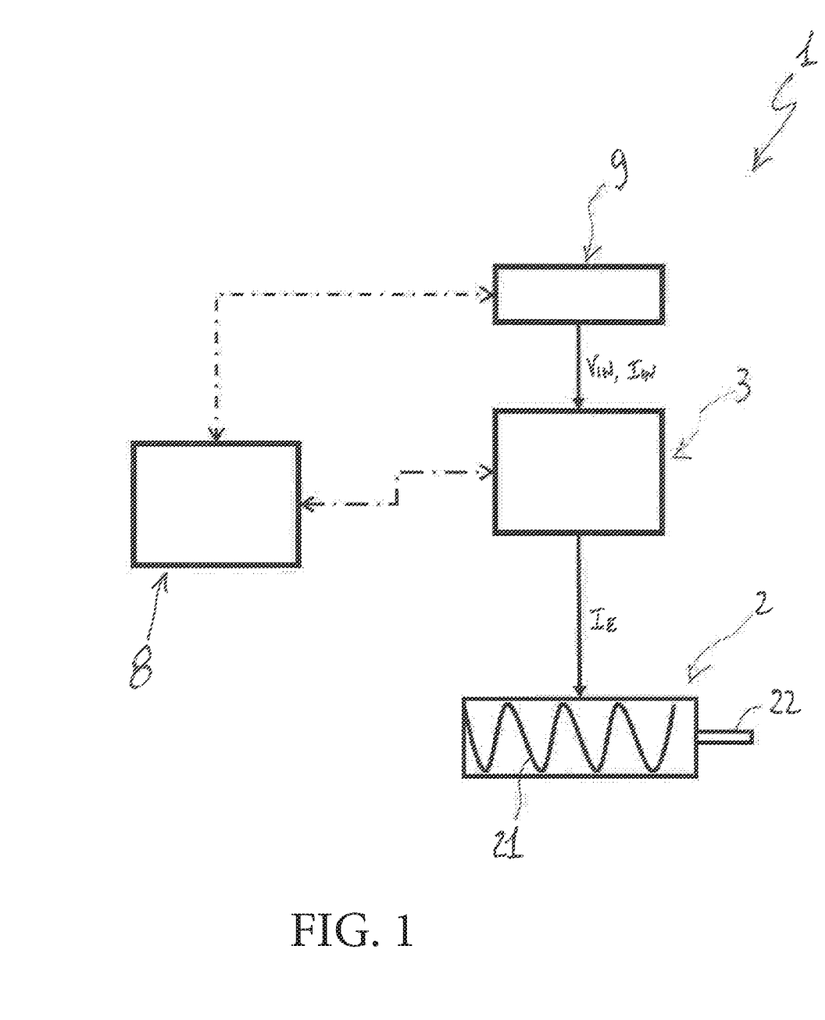
FIG. 1 is a schematic view of a coil actuator according to the invention.
Figure 2:
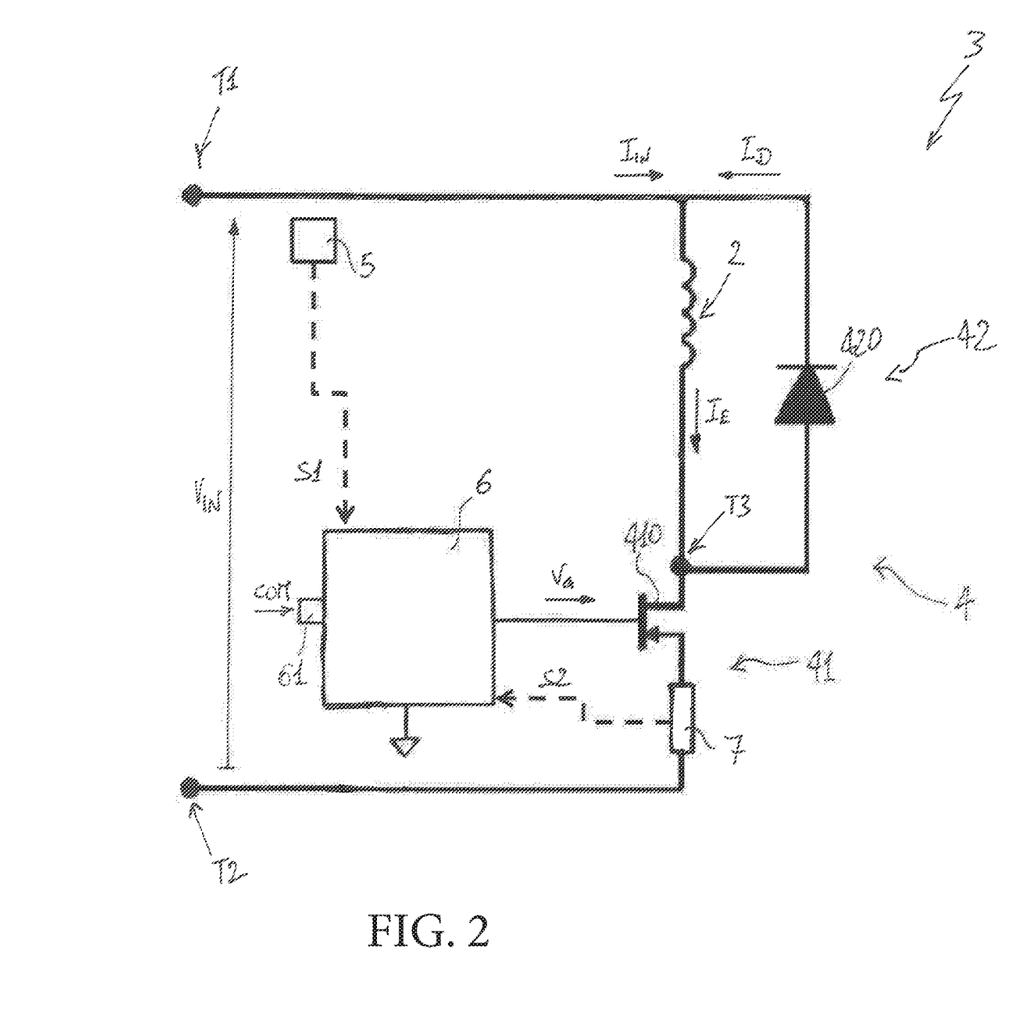
FIG. 2 is a schematic view of a power and control unit included in the coil actuator according to the invention.
Figure 3:
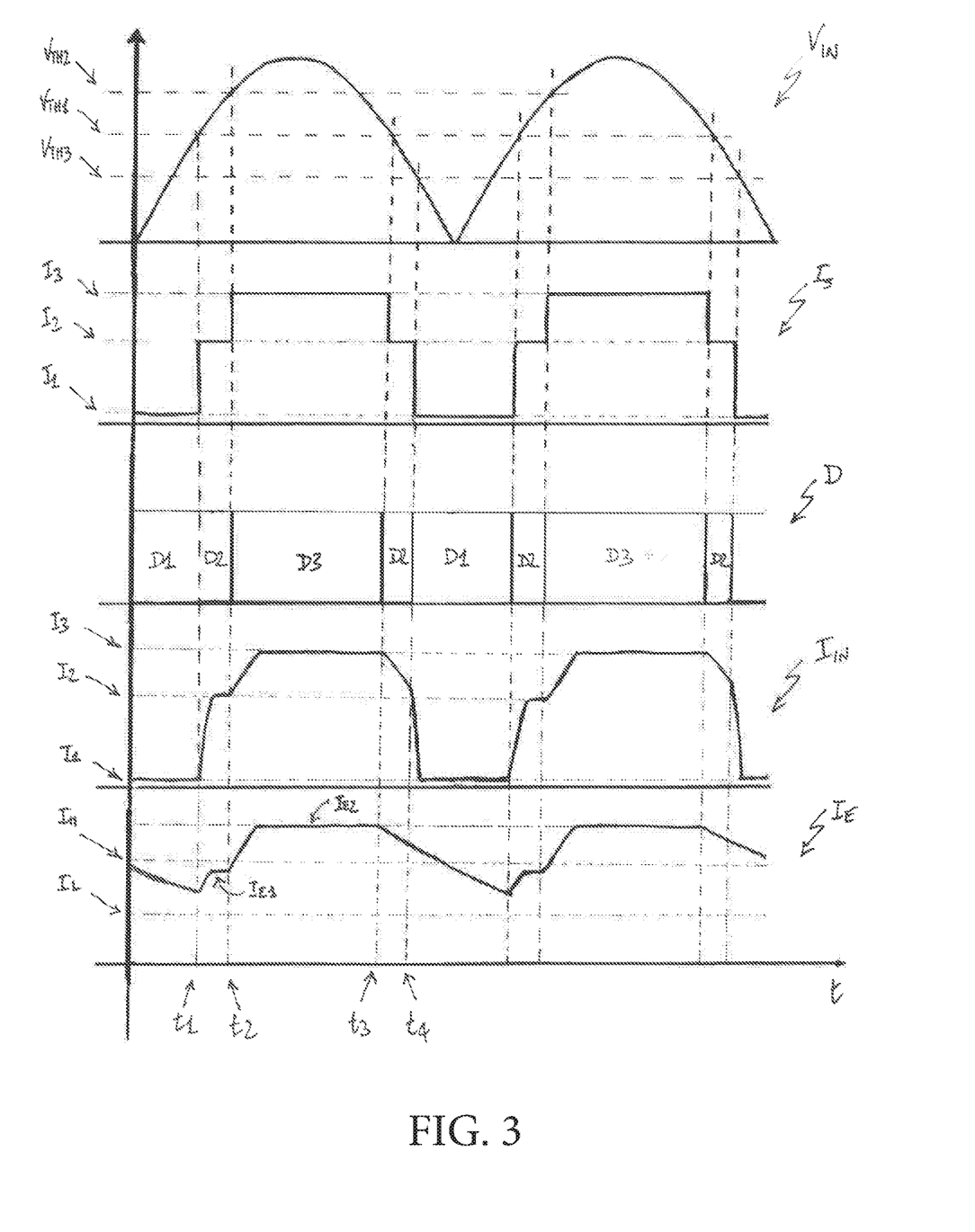
FIG. 3 is an example of operation of the coil actuator according to the invention.

With reference to the cited figures, the present invention relates to a coil actuator 1 for low and medium voltage applications.

Conveniently, the coil actuator 1 is intended to be installed in low or medium voltage apparatuses, such as low or medium voltage circuit breakers, disconnectors, contactors, and the like.

In general, the coil actuator 1 conveniently comprises a casing (not shown) defining a volume in which the internal components of said coil actuator are accommodated.

According to the invention, the coil actuator 1 comprises a coil electromagnet 2 provided with a single coil winding 21 and a movable anchor 22.

The movable anchor 22 is conveniently movable between a rest position and a launch position upon the application of an actuation force.

The movable anchor 22 is moved from the rest position to the launch position (launch operation) by a magnetic force due to a magnetic flux generated by an excitation current $I_E$ flowing along the coil electromagnet 2, more precisely along the single winding 21 of this latter.

Preferably, the movable anchor 22 is moved from the launch position to the rest position (release operation) by a mechanical force exerted by mechanical means (not shown) included in the coil electromagnet 2, such as a spring suitably charged during the launch operation of the coil electromagnet.

Preferably, the movable anchor 22 cannot stably maintain the above-mentioned launch position. To maintain this condition, an excitation current $I_E$ has still to flow along the coil electromagnet 2 (hold operation). Once such an excitation current is interrupted or sufficiently reduced, the movable anchor 22 returns in the rest position due to the opposing force exerted by the above-mentioned mechanical means.

Conveniently, when the coil actuator 1 is installed in a low or medium voltage apparatus, the movable anchor 22 is operatively coupled with a kinematic mechanism of said apparatus. As an example, when the coil actuator 1 is installed in a medium voltage circuit breaker, the movable anchor 22 may be operatively coupled with the primary command chain of the circuit breaker. According to the invention, the coil actuator 1 comprises a power and control unit 3 operatively coupled with the coil electromagnet 2 to suitably control the operation of this latter.

The power and control unit 3 comprises a power circuit 4 and a PWM controller 6.

The power circuit 4 is operatively coupled with the coil electromagnet 2 to drive this latter upon receiving an input voltage $V_{IN}$ at suitable input terminals T1, T2. In this way, when the power circuit is fed with the input voltage $V_{IN}$, the coil electromagnet 2 can be fed by a suitable excitation current $I_E$ and an operation of the coil electromagnet 2 can be carried out. Preferably, the input voltage $V_{IN}$ has a DC waveform.

More preferably, the input voltage $V_{IN}$ has a rectified full-wave sinusoidal waveform having a given operating frequency (e.g. 50 Hz).

However, in principle, the input voltage $V_{IN}$ may have different waveforms, such as a rectified half-wave sinusoidal waveform, a pulsed waveform or a continuous waveform.

Preferably, the power and control unit 3 comprises first sensing means 5 (e.g. a resistive divider) adapted to provide first detection signals S1 indicative of a behavior of the input voltage $V_{IN}$ received by the power circuit 4.

As it will better emerge from the following, an input current $I_{IN}$ may flow through the power circuit 4, when an input voltage $V_{IN}$ is supplied to this latter.

Preferably, the power and control unit 3 comprises second sensing means 7 (e.g. a resistive shunt) adapted to provide second detection signals S2 indicative of a behavior of the input voltage $I_{IN}$ received by the power circuit 4.

The PWM controller 6 is operatively coupled with the power circuit 4 to control the operation of this latter. In particular, as it will be better emerge from the following, the PWM controller 6 is adapted to control the input current $I_{IN}$ flowing through the power circuit 4.

Preferably, the PWM controller 6 is operatively coupled with the first sensing means 5 in order to receive and process the first detection signals S1, and possibly, with the second sensing means 7 in order to receive and process the second detection signals S2.

The PWM controller 6 may include one or more computerized units (e.g. microprocessors) configured to execute software instructions to carry out the functionalities provided for said controller. In general, the PWM controller 6 may be may be realized according to solutions of known type and it will be hereinafter described only for the aspects relevant to the invention, for the sake of brevity.

Preferably, the coil actuator 1 comprises or is operatively connected with a further control unit 8 adapted to interact with the power and control unit 3, for example with the PWM controller 6.

The control unit 8 may include one or more computerized units (e.g. microprocessors) configured to execute software instructions to carry out the functionalities provided for said control unit. In general, the control unit 8 may be realized according to solutions of known type and it will be hereinafter described only for the aspects relevant to the invention, for the sake of brevity.

Preferably, the coil actuator 1 comprises a power supply unit 9 operatively coupled with the power and control unit 3 and, possibly, with the control unit 8, to feed these latter units.

In particular, the power supply unit 9 is adapted to provide the input voltage $V_{IN}$ received by the power circuit 4 of the power and control unit 3.

Preferably, the power supply stage 9 comprises a power supply circuit (not shown) adapted to receive a power supply voltage from a power supply source (e.g. an electric line).

Preferably, the power supply stage 9 comprises a filter circuit (e.g. a LC filter—not shown) that may be configured to cut high frequency current components (possibly generated by the PWM controller 6) or other disturbances coming from the power supply source.

Preferably, the power supply stage 9 comprises a rectifier circuit (e.g. a circuit bridge—not shown) to convert the power supply voltage (e.g. a sinusoidal voltage) provided by the above-mentioned power supply circuit into a suitable input voltage $V_{IN}$ (e.g. a rectified sinusoidal voltage) to be received by the by the power circuit 4 of the power and control unit 3.

The power supply stage 9 may further comprise additional power supply circuitry (not shown) to feed specific components of the coil actuator (e.g. the PWM controller 6 and the control unit 8) with suitable power supply voltages.

The operation of the power supply stage 9 may be controlled by the further control unit 8, at least for what concerning the feeding of the power and control unit 3.

In general, the power supply stage 9 may be realized according to solutions of known type and it will be hereinafter described only for the aspects relevant to the invention, for the sake of brevity.

As mentioned above, the power circuit 4 comprises a first input terminal T1 and a second input terminal T2, at which it receives the input voltage $V_{IN}$ and, possibly, the input current $I_{IN}$ from the power supply unit 9.

Preferably, the power circuit 4 comprises a switch circuit 41 and a discharge circuit 42.

Preferably, the power circuit 4 comprises an intermediate electric node T3 at which the electromagnet 2, the switch circuit 41 and the discharge circuit 42 are electrically connected.

Preferably, the discharge circuit 42 is electrically connected in parallel with the electromagnet 2 (more precisely with the winding 21 of this latter) between the first input terminal T1 and the electric node T3.

Conveniently, the discharge circuit 42 is designed to allow the equivalent inductance formed by the electromagnet 2 to discharge when this latter is not fed by the input current $I_{IN}$.

To this aim, the discharge circuit 42 comprises a free-wheeling device suitably arranged to allow the circulation of a discharge current ID when the equivalent inductance formed by the electromagnet 2 is subject to discharge.

Preferably, said free-wheeling device comprises a free-wheeling diode 420 (which may be of conventional type) having its anode and cathode electrically connected respectively with the electric node T3 and the first input terminal T1.

Preferably, the switch circuit 41 is electrically connected in series with the parallel group formed by the discharge circuit 42 and the coil electromagnet 2.

More precisely, the switch circuit 41 is electrically connected between the electric node T3 and the second input terminal T2.

Conveniently, the switch circuit 41 is designed to allow/prevent the input current $I_{IN}$ (which is received by the power circuit 4 when the input voltage $V_{IN}$ is applied at its input terminals T1, T2) to feed the coil electromagnet 2. To this aim, the switch circuit 41 comprises at least power switch 410.

Preferably, said at least a power switch comprises a power switch 410, which may be of conventional type, for example a power MOSFET or BJT.

Preferably, the power switch 410 has its drain or collector terminal and its source or emitter terminal electrically connected respectively with the electric node T3 and the second input terminal T2.

The power switch 410 is conveniently adapted to switch with a given switch frequency between a conduction state and an interdiction state.

The above-mentioned switch frequency is normally very higher than the operating frequency of the electric quantities characterizing the power circuit 4. As an example, the switching frequency of said power switch may of 10 kHz whereas the input voltage $V_{IN}$ may have an operating frequency of some tens of Hz.

When the power switch 410 is in a conduction state, the input current $I_{IN}$ is allowed to flow through the power circuit 4, more precisely along the electromagnet 2 passing through said power switch and the input terminals T1, T2. In this case, the equivalent inductance formed by the electromagnet 2 is charged. Additionally, the free-wheeling diode 420 is in an interdiction state and no currents will flow through it (with the exception of small leakage currents).

When the power switch 410 is in an interdiction state, the input current $I_{IN}$ is interrupted. Thus, no currents will pass through it (with the exception of small leakage currents) and the input terminals T1, T2. In this case, the free-wheeling diode 420 is in a conduction state and a discharge current ID will flow through the discharge circuit 42, thereby causing the discharge of the equivalent inductance formed by the electromagnet 2.

Preferably, the PWM controller 6 is operatively coupled with the switch circuit 41 to control the operation of the above-mentioned at least power switch 410.

Preferably, the PWM controller 6 is adapted to control the power switch 410. To this aim, it conveniently provides control signals $V_G$ (e.g. voltage signals of the pulsed type) to the gate or base terminal of such a power switch.

Preferably, the PWM controller 6 is adapted to control a duty-cycle value D of the power switch 410.

In this way, according to the well-known principles of PWM-like controls, the PWM controller 6 is capable of controlling an average value of the input current $I_{IN}$ (in a time interval very longer than the switching period of the power switch 410, such the period of the input voltage $V_{IN}$) in such a way to make this latter to follow a given reference value (e.g. the reference value $I_1$ or $I_2$ or $I_3$ as it will better emerge from the following) set for said input current.

In practice, the PWM controller 6 compares the measured average values of the input current $I_{IN}$ (provided by the second detection signals S2 sent by the second sensing means 7) with the set reference value $I_1$, $I_2$, $I_3$ and varies the duty-cycle value D of the power switch 410 on the base of an error value obtained from such a comparison.

Obviously, an increase or decrease of the duty-cycle value D of the power switch 410 will determine a corresponding increase or decrease of the average value of the input current $I_{IN}$, respectively.

According to some embodiments (as shown in FIG. 2), the switch circuit 41 may include the above-mentioned second sensing means 7. In this case, the second sensing means 7 may be formed a resistive shunt electrically connected in series with the power switch 410 and the input terminal T2 of the power circuit 4.

In order to operate, the electromagnet 2 (more precisely along the winding 21 of this latter) has to be fed with an excitation current $I_E$ having an average operating level $I_L$, $I_H$ for a corresponding time interval, which may be in the order of hundreds of ms, e.g. equal to some tens of time periods of the input voltage $V_{IN}$, when this latter is a periodic signal.

The average operating level to be obtained for the excitation current $I_E$ may be a predetermined launch level $I_L$, through which the coil actuator 1 carries out a launch operation of the electromagnet 2, or a predetermined hold level $I_H$, through which the coil actuator 1 carries out a hold operation of the electromagnet 2.

In principle, however, the average operating level to be obtained for the excitation current $I_E$ may be of different type, for example a coil supervision level (not shown) to allow checking the integrity of the winding 21 of the electromagnet 2, when the anchor 22 is a rest position.

According to the invention, the PWM controller 6 is adapted to control the input current $I_{IN}$ flowing through the power circuit 4 in such a way to obtain and maintain an average operating level $I_L$, $I_H$ selected for the excitation current $I_E$ An important feature of the present invention consists in that the PWM controller 6 is adapted to set a plurality of different reference values $I_1$, $I_2$, $I_3$ for the input current $I_{IN}$ to control said input current (through a PWM control) in such a way to obtain the average operating level $I_L$, $I_H$ selected for the excitation current $I_E$ flowing through the electromagnet 2.

In other words, the PWM controller 6 is adapted to set a plurality of different reference values $I_1$, $I_2$, $I_3$ to be followed by the input current $I_{IN}$ whenever an average operating level $I_L$, $I_H$ is selected for the excitation current $I_E$ flowing through the electromagnet 2 in order to carry out an operation of the electromagnet 2.

Conveniently, the PWM controller 6 is adapted to set a different plurality of reference values $I_2$, $I_3$ for each average operating level $I_L$, $I_H$ selected for the excitation current $I_E$.

Preferably, as it will better emerge from the following, the PWM controller 6 is adapted to set a different triad of reference values $I_1$, $I_2$, $I_3$ for each average operating level $I_L$, $I_H$ selected for the excitation current $I_E$.

A further important feature of the present invention consists in the PWM controller 6 is adapted to select from time to time (i.e. instant by instant) each reference value $I_1$, $I_2$, $I_3$ to be set for the input current $I_{IN}$ depending on the behavior of the input voltage $V_{IN}$, more particularly depending on the instantaneous value $V_{IN}(t)$ taken said input voltage (conveniently as detected by the first sensing means 5).

The provision of a plurality of different reference values $I_1$, $I_2$, $I_3$ to be set for the input current $I_{IN}$ is particularly useful when the input voltage $V_{IN}$ is intrinsically variable, for example since it has rectified sinusoidal waveform or a pulsed waveform, or it is somehow subject to variations.

Preferably, when the input voltage $V_{IN}$ is subject to an increase (e.g. during a suitable half-period of a rectified sinusoidal waveform), the PWM controller 6 is adapted to select:
  a first reference value $I_1$ to be set for the input current $I_{IN}$ until the input voltage $V_{IN}$ is lower than a first threshold value $V_{TH1}$;
  a second reference value $I_2$ to be set for the input current $I_{IN}$ if the input voltage $V_{IN}$ increases above the first threshold value $V_{TH1}$. The second reference value $I_2$ higher than the first reference value $I_1$;
  a third reference value $I_3$ to be set for the input current $I_{IN}$ if the input voltage $V_{IN}$ increases above a second threshold value $V_{TH2}$ higher than the first threshold value $V_{TH1}$. The third reference value $I_3$ is higher than the second reference value $I_2$.

Preferably, when the input voltage $V_{IN}$ is subject to a decrease (e.g. during another suitable half-period of a rectified sinusoidal waveform), the PWM controller 6 is adapted to select:
  the third reference value $I_3$ to be set for the input current $I_{IN}$ until the input voltage $V_{IN}$ is higher than the first threshold value $V_{TH1}$;
  the second reference value $I_2$ to be set for the input current $I_{IN}$ if the input voltage $V_{IN}$ decreases under the first threshold value $V_{TH1}$;
  the first reference value $I_1$ to be set for the input current $I_{IN}$ if the input voltage $V_{IN}$ decreases under a third threshold value $V_{TH3}$ lower than the first threshold value $V_{TH1}$.

The above-mentioned threshold values $V_{TH1}$, $V_{TH2}$, $V_{TH3}$ may be predetermined or selected from time to time (i.e. instant by instant) depending on the selected reference values $I_1$, $I_2$ or $I_3$ to be set for the input current $I_{IN}$. In this last case, when it selects a plurality of reference values $I_1$, $I_2$ or $I_3$, the PWM selects also a corresponding plurality of threshold values $V_{TH1}$, $V_{TH2}$, $V_{TH3}$ to be checked for setting said reference values.

Conveniently, the reference values $I_1$, $I_2$, $I_3$ and the threshold values $V_{TH1}$, $V_{TH2}$, $V_{TH3}$ are stored by the PWM controller 6 in a suitable memory.

The setting of multiple reference values $I_1$, $I_2$, $I_3$ to be followed by the input current $I_{IN}$ depending on the behavior of the input voltage $V_{IN}$ allows obtaining a better control of the average value of the excitation current $I_E$ and therefore it remarkably facilitates the obtaining of an average operating level $I_L$, $I_H$ selected for the excitation current $I_E$.

In addition, the setting of multiple reference values $I_1$, $I_2$, $I_3$ for the input current $I_{IN}$ allows avoiding the usage of electrolytic capacitors to store the electric energy necessary to properly drive the electromagnet 2 when the input voltage $V_{IN}$ varies.

In fact, the multiple reference values $I_1$, $I_2$, $I_3$ may be designed in such a way that the electromagnet 2 is subject to an extra-charge when the duty-cycle of the power switch 410 increases due to an increase of the input voltage $V_{IN}$.

In this way, it is prevented an excessive discharge of the electromagnet 2 when the duty-cycle of the power switch 410 is decreased due to a decrease of the input voltage $V_{IN}$.

Preferably, the PWM controller 6 is adapted to select the average operating level $I_L$, $I_H$ to be obtained for the excitation current $I_E$ and a corresponding plurality of reference values $I_1$, $I_2$, $I_3$ to be set for the input current $I_{IN}$ depending on the behavior of the input voltage $V_{IN}$, more specifically depending on one or more characteristic parameters (e.g. the peak value, the RMS value or the like) detected for the input voltage $V_{IN}$.

Conveniently, the PWM controller 6 continuously checks one or more characteristic parameters of the input voltage $V_{IN}$ through the first sensing means 5.

Basing on such a checking, the PWM controller 6 acquires information on the operating status of the coil actuator 1 and, accordingly, it selects the average operating level $I_L$, $I_H$ to be obtained for the excitation current $I_E$ and the corresponding plurality of reference values $I_1$, $I_2$, $I_3$ according to which the input current $I_{IN}$ is controlled, As an example, when the RMS value of the voltage $V_{IN}$ exceeds a given threshold, the PWM controller 6 detects that an incoming launch operation of the electromagnet 2 has to be carried out and it selects a predetermined launch level $I_L$ to be obtained for the excitation current $I_E$ and a corresponding plurality of reference values $I_1$, $I_2$, $I_3$ to be followed by the excitation current $I_E$ in such a way that said predetermined launch level $I_L$ for the excitation current $I_E$ is obtained and the desired launch operation is carried out.

Conveniently, said one or more characteristic parameters of the input voltage $V_{IN}$ may be varied by the power supply unit 9 upon receiving suitable control signals sent by the additional control unit 8.

In combination with or alternatively to the above solution, the PWM controller 6 may select the average operating level $I_L$, $I_H$ to be obtained for the excitation current $I_E$ and the corresponding plurality of reference values $I_1$, $I_2$, $I_3$ for the input current $I_{IN}$ in response to control signals COM received at a suitable communication port 61 (e.g. a CAN-bus communication port). The control signals COM may be transmitted by the additional control unit 8 of the coil actuator 1 to suitably mange the operation of this latter.

Referring to FIGS. 2-3, an example of operation of the power and control unit 3 is now described in further details.

In this example, the power circuit 4 is supposed to receive an input voltage $V_{IN}$ having a rectified full-wave sinusoidal waveform (e.g. with a period of 10 ms), as shown in FIG. 3. Additionally, the electromagnet 2 is supposed have already carried out some charge/discharge cycles.

The PWM controller 6 is supposed to select an average operating level $I_H$ (hold level) to be obtained for the excitation current $I_E$ for a given time interval (e.g. 100 ms—equal to 10 periods of the input voltage $V_{IN}$) to carry out a hold operation of the electromagnet 2

Accordingly, the PWM controller 6 selects a triad of stored reference values $I_1$, $I_2$, $I_3$ (and possibly a corresponding triad of threshold values for the input voltage $V_{TH1}$, $V_{TH2}$, $V_{TH3}$) to be used for carrying out a PWM control of the input current $I_{IN}$ and obtaining the selected launch level $I_L$ for the excitation current $I_E$.

In order to select the most suitable reference value $I_1$, $I_2$ or $I_3$ to be set for the input current $I_{IN}$, the PWM checks the behavior of the input voltage $V_{IN}$ basing on the first detection signals provided by the first sensing means 5.

In a first half-period, the input voltage $V_{IN}$ is subject to an increase.

Initially, the input voltage $V_{IN}$ is lower than the first threshold value $V_{TH1}$. The PWM controller 6 thus selects the first reference value $I_1$ for the input current $I_{IN}$. In order to force the input current $I_{IN}$ to follow the reference value $I_1$, the PWM controller 6 provides control signals $V_G$ to the power switch 410 to operate this latter with a first duty-cycle value D1 that is relatively low. The input current $I_{IN}$ will follow the first reference value $I_1$. As first duty-cycle value has been previously decreased, the excitation current $I_E$ decreases towards a certain steady-state value (not shown) that depends on the reference value $I_1$ set for the input current $I_{IN}$ and the first duty-cycle value D1 set for the power switch 410.

At the instant $t_1$, the input voltage $V_{IN}$ exceeds the first threshold value $V_{TH1}$. The PWM controller 6 thus selects the second reference value $I_2$ to be set for the input current $I_{IN}$. The second reference value $I_2$ is higher than the first reference value $I_1$. The PWM controller 6 provides control signals $V_G$ to the power switch 410 to operate this latter with a second duty-cycle value D2 that is higher than the first duty-cycle value D1. The input current $I_{IN}$ will increase to follow the second reference value $I_2$. As the duty-cycle value for the power switch 410 is now higher, the excitation current $I_E$ stops decreasing (in this case without reaching the above-mentioned steady state value) and starts increasing to reach a new higher steady state value $I_{E1}$. The new steady state value $I_{E1}$ depends on the reference value $I_2$ set for the input current $I_{IN}$ and the second duty-cycle value D2 set for the power switch 410. In practice, the new steady state value $I_{E1}$ is given by the following relation $I_{E1}=I_{IN}*D2$. The excitation current $I_E$ will remain constant at the steady state value $I_{E1}$ until the duty-cycle of the power switch 410 changes again.

At the instant $t_2$, the input voltage $V_{IN}$ exceeds the second threshold value $V_{TH2}$. The PWM controller 6 thus selects the third reference value $I_3$ to be set for the input current $I_{IN}$. The third reference value $I_3$ is higher than the second reference value $I_2$. The PWM controller 6 provides control signals $V_G$ to the power switch 410 to operate this latter with a third duty-cycle value D3 that is higher than the second duty-cycle value D2. The input current $I_{IN}$ will again increase to follow the third reference value $I_3$. As the duty-cycle value set for the power switch 410 is still higher, the excitation current $I_E$ continues to increase until it reaches a still higher new steady state value $I_{E2}$. The steady state value $I_{E2}$ depends on the reference value $I_3$ set for the input current $I_{IN}$ and the second duty-cycle value D3 set for the power switch 410. In practice, the steady state value $I_{E2}$ is given by the following relation $I_{E2}=I_{IN}*D3$. The excitation current $I_E$ will remain constant at the steady state value $I_{E2}$ until the duty-cycle of the power switch 410 changes again. It is observed that the electromagnet 2 is subject to an extra-charge when excitation current $I_E$ is at the steady state value $I_{E2}$ with respect to a steady-state condition with the excitation current $I_E$ is at the steady state value $I_{E1}$, which, in principle, would be closer to the selected average operating level $I_H$. As it will apparent in the following, however, such an extra-charge of the electromagnet 2 is useful to prevent an excessive discharge of this latter when the input voltage $V_{IN}$ decreases.

In a second half-period, the input voltage $V_{IN}$ is subject to a decrease.

Initially, the input voltage $V_{IN}$ remains higher than the first threshold value $V_{TH1}$. The PWM controller 6 thus maintains the third reference value $I_3$ for the input current $I_{IN}$. The input current $I_{IN}$ will continue to follow the third reference value $I_3$ and the excitation current $I_E$ continues to maintain the steady state value $I_{E2}$.

At the instant $t_3$, the input voltage $V_{IN}$ decreases below the first threshold value $V_{TH1}$. The PWM controller 6 thus selects the second reference value $I_2$ to bet set for the input current $I_{IN}$. The PWM controller 6 provides control signals $V_G$ to the power switch 410 to operate this latter with the corresponding second duty-cycle value D2. The input current $I_{IN}$ decreases to follow the second reference value $I_2$. As the duty-cycle value set for the power switch 410 is now lower, the excitation current $I_E$ starts decreasing towards the lower steady state value $I_{E1}$. At the instant $t_4$, the input voltage $V_{IN}$ decreases below the third threshold value $V_{TH3}$. The PWM controller 6 thus selects the first reference value $I_1$ to be set for the input current $I_{IN}$. The PWM controller 6 provides control signals $V_G$ to the power switch 410 to operate this latter with the corresponding first duty-cycle value D1. The input current $I_{IN}$ decreases to follow the first reference value $I_1$. As the duty-cycle value set for the power switch 410 is still lower, the excitation current $I_E$ continues decreasing (in this case without stopping at the steady state value $I_{E1}$) towards a still lower new steady state value. The excitation current $I_E$ will continue to decrease until the duty-cycle of the power switch 410 changes again. As mentioned above, such a change of the duty-cycle of the power switch 410 will conveniently occur before the excitation current $I_E$ reaches the new lower steady state value since the electromagnet 2 has a prolonged discharge time due to the undergone extra-charge when excitation current $I_E$ was at the steady state value $I_{E2}$. In this way, an excessive discharge of the electromagnet 2 is prevented.

At the following periods of the input voltage $V_{IN}$, the above described operation of the power and control unit 3 is repeated. The excitation current $I_E$ thus varies about the selected average operating level $I_H$ without the contribution of stored energy to be provided by electrolytic capacitors.

The above described operation of the power and control unit 3 will be conveniently repeated until the PWM controller 6 selects another average operating level (e.g. the launch level $I_L$) to be obtained for the excitation current $I_E$.

In this last case, the PWM controller 6 will control the input current $I_{IN}$ in such a way to make the excitation current $I_E$ to vary about the selected launch level $I_L$ by suitably selecting the reference values $I_1$, $I_2$, $I_3$ at each period of the input voltage $V_{IN}$.

The coil actuator 1, according to the invention, allows achieving the intended aims and objects.

The coil actuator 1 is provided with a power and control unit 3 having a compact design and capable of properly driving the electromagnet 2 without the employment of electrolytic capacitors. Higher levels of reliability and a longer operating life with respect to solutions used in currently available coil actuators are ensured.

The coil actuator 1 can be easily manufactured at industrial level at competitive costs with respect to currently available devices of the same type.

The invention claimed is:

1. A coil actuator for low and medium voltage applications comprising:
    a coil electromagnet provided with a single coil winding and a movable anchor;
    a power and control unit comprising:
        a power circuit operatively coupled with said coil electromagnet, said power circuit comprising input terminals, at which said power circuit receives an input voltage;
        a PWM controller operatively coupled with said power circuit, said PWM controller being adapted to control an input current flowing through said power circuit to obtain an average operating level selected for an excitation current feeding said coil electromagnet;
    wherein said PWM controller is adapted to set a plurality of reference values for said input current to control said input current and obtain the average operating level selected for said excitation current, each reference value to be set for said input current being selected among said plurality of reference values depending on the behavior of said input voltage; and
    wherein when said input voltage is subject to an increase, said PWM controller is adapted to select:
        a first reference value to be set for said input current until said input voltage is lower than a first threshold value;
        a second reference value to be set for said input current if said input voltage increases above said first threshold value, said second reference value being higher than said first reference value; and
        a third reference value to be set for said input current if said input voltage increases above a second threshold value higher than said first threshold value, said third reference value being higher than said second reference value.

2. The coil actuator according to claim 1, wherein when said input voltage is subject to a decrease, said PWM controller is adapted to select:
    a third reference value to be set for said input current until said input voltage is higher than said first threshold value;
    a second reference value to be set for said input current if said input voltage decreases under said first threshold value, said third reference value being higher than said second reference value;
    a first reference value to be for said input current if said input voltage decreases under a third threshold value lower than said first threshold value, said second reference value being higher than said first reference value.

3. The coil actuator according to claim 1, wherein said power and control unit comprises first sensing means adapted to provide first detection signals indicative of a behavior of said input voltage, said PWM controller being adapted to receive and process said first detection signals.

4. The coil actuator according to claim 1, wherein said power and control unit comprises second sensing means adapted to provide second detection signals indicative of a behavior of said input current, said PWM controller being adapted to receive and process said second detection signals.

5. The coil actuator according to claim 1, wherein said power circuit comprises a discharge circuit, which is electrically connected with a first input terminal and an electric node of said power circuit in parallel with said coil electromagnet, and a switch circuit, which is electrically connected with said electric node and a second input terminal of said power circuit, said switch circuit comprising at least a power switch, said PWM controller being operatively coupled with said switch circuit to control operation of said at least a power switch.

6. The coil actuator according to claim 5, wherein said at least a power switch comprises a power switch adapted to switch with a given switch frequency between a conduction state, at which said input current is allowed to flow through said power circuit, and an interdiction state, at which said input current is in a conduction state.

7. The coil actuator according to claim 6, wherein a discharge current flows along said discharge circuit, when said power switch is in a conduction state.

8. The coil actuator according to claim 6, wherein said PWM controller is adapted to control a duty-cycle value of said power switch in order to make said input current to reach a reference value set for said input current.

9. The coil actuator according to claim 1, wherein said PWM controller is adapted to select an average operating level to be obtained for said excitation current and a corresponding plurality of reference values to be set for said input current depending on one or more characteristic parameters detected for said input voltage.

10. The coil actuator according to claim 1, wherein said PWM controller is adapted to select the average operating level to be obtained for said excitation current and a corresponding plurality of reference values to be set for said input current in response to control signals received at a communication port.

11. A low or medium voltage apparatus, comprising a coil actuator according to claim 1.

12. The coil actuator according to claim 7, wherein said PWM controller is adapted to control a duty-cycle value of said power switch in order to make said input current to reach a reference value set for said input current.

13. The coil actuator according to claim 1, wherein when said input voltage is subject to a decrease, said PWM controller is adapted to select:
- a third reference value to be set for said input current until said input voltage is higher than said first threshold value;
- a second reference value to be set for said input current if said input voltage decreases under said first threshold value, said third reference value being higher than said second reference value;
- a first reference value to be for said input current if said input voltage decreases under a third threshold value lower than said first threshold value, said second reference value being higher than said first reference value.

14. The coil actuator according to claim 13, wherein said power and control unit comprises first sensing means adapted to provide first detection signals indicative of a behavior of said input voltage, said PWM controller being adapted to receive and process said first detection signals.

15. The coil actuator according to claim 14, wherein said power and control unit comprises second sensing means adapted to provide second detection signals indicative of a behavior of said input current, said PWM controller being adapted to receive and process said second detection signals.

16. The coil actuator according to claim 15, wherein said power circuit comprises a discharge circuit, which is electrically connected with a first input terminal and an electric node of said power circuit in parallel with said coil electromagnet, and a switch circuit, which is electrically connected with said electric node and a second input terminal of said power circuit, said switch circuit comprising at least a power switch, said PWM controller being operatively coupled with said switch circuit to control operation of said at least a power switch.

17. The coil actuator according to claim 16, wherein said at least a power switch comprises a power switch adapted to switch with a given switch frequency between a conduction state, at which said input current is allowed to flow through said power circuit, and an interdiction state, at which said input current is in a conduction state.

18. The coil actuator according to claim 17, wherein a discharge current flows along said discharge circuit, when said power switch is in a conduction state.

19. The coil actuator according to claim 18, wherein said PWM controller is adapted to control a duty-cycle value of said power switch in order to make said input current to reach a reference value set for said input current.

* * * * *